(12) United States Patent
Lindström et al.

(10) Patent No.: US 10,043,614 B2
(45) Date of Patent: Aug. 7, 2018

(54) DYE-SENSITIZED SOLAR CELL AND A METHOD FOR MANUFACTURING THE SOLAR CELL

(71) Applicant: Exeger Operations AB, Stockholm (SE)

(72) Inventors: Henrik Lindström, Åkersberga (SE); Giovanni Fili, Stockholm (SE)

(73) Assignee: Exeger Operations AB, Stockholm (SE)

( * ) Notice: Subject to any disclaimer, the term of this patent is extended or adjusted under 35 U.S.C. 154(b) by 0 days.

(21) Appl. No.: 14/891,688

(22) PCT Filed: May 16, 2014

(86) PCT No.: PCT/EP2014/060163
§ 371 (c)(1),
(2) Date: Nov. 17, 2015

(87) PCT Pub. No.: WO2014/184379
PCT Pub. Date: Nov. 20, 2014

(65) Prior Publication Data
US 2016/0126019 A1 May 5, 2016

(30) Foreign Application Priority Data
May 17, 2013 (SE) .................................. 1350611

(51) Int. Cl.
*H01G 9/20* (2006.01)
*H01L 51/42* (2006.01)

(52) U.S. Cl.
CPC ......... *H01G 9/2059* (2013.01); *H01G 9/2013* (2013.01); *H01G 9/2031* (2013.01);
(Continued)

(58) Field of Classification Search
CPC .............................. H01G 9/2059; H01G 9/20
See application file for complete search history.

(56) References Cited

U.S. PATENT DOCUMENTS

2011/0240116 A1 10/2011 Morooka
2012/0305073 A1* 12/2012 Hayase ............... H01G 9/2068
136/256
(Continued)

FOREIGN PATENT DOCUMENTS

EP 1 624 472 A2 2/2006
EP 1624472 A2 * 2/2006 ........... H01G 9/2031
(Continued)

OTHER PUBLICATIONS

O'Regan et al., A Solid-State Dye-Sensitized Solar Cell Fabricated with Pressure-Treated P25-TiO2 and CuSCN: Analysis of Pore Filling and IV Characteristics, 2002, Chemical Materials, 14, All Pages.*

(Continued)

*Primary Examiner* — Devina Pillay
*Assistant Examiner* — Daniel P Malley, Jr.
(74) *Attorney, Agent, or Firm* — Dilworth & Barrese, LLP (57) ABSTRACT

The present invention relates to a dye-sensitized solar cell including a light absorbing layer (1), a first conducting layer (2) for extracting photo-generated electrons from the light absorbing layer, a counter electrode including a second conducting layer (3), a porous insulating layer (5b) disposed between the first and second conducting layers, and a conducting medium for transferring charges between the counter electrode and the working electrode. The solar cell further comprises a third conducting layer (6b) disposed between the porous insulating layer (5b) and the second conducting layer (3) and in electrical contact with the second conducting layer, and the third conducting layer includes a porous substrate (8) made of an insulating material and conducting particles accommodated in the pores of the (Continued)

porous substrate and forming a conducting network (9) through the insulating material.

17 Claims, 2 Drawing Sheets

(52) U.S. Cl.
CPC ....... *H01G 9/2068* (2013.01); *H01L 51/4226* (2013.01); *Y02E 10/542* (2013.01); *Y02E 10/549* (2013.01); *Y02P 70/521* (2015.11)

(56) References Cited

U.S. PATENT DOCUMENTS

2013/0199603 A1* 8/2013 Snaith .................. H01L 51/422
136/255
2013/0269781 A1* 10/2013 Ko ....................... H01G 9/2018
136/263

FOREIGN PATENT DOCUMENTS

| | | | | |
|---|---|---|---|---|
| EP | 1624472 A2 * | 2/2006 | ........... | H01G 9/2031 |
| JP | 2011-216190 A | 10/2011 | | |
| WO | 97/16838 A1 | 5/1997 | | |
| WO | 2011/096154 A1 | 8/2011 | | |
| WO | WO 2012045881 A1 * | 4/2012 | ........... | H01G 9/2022 |
| WO | 2013/053501 A1 | 4/2013 | | |
| WO | 2013/171520 A1 | 11/2013 | | |

OTHER PUBLICATIONS

Lee et al., "Efficient Hybrd Solar Cells Based on Meso-Superstructured Organometal Halide Perovskites", 2012, Science, vol. 338, All Pages.*

EPO translation of EP 1,624,472 A2 (Year: 2017).*

Chung et al, "All-solid-state dye-sensitized solar cells with high efficiency," Nature vol. 485, May 24, 2012, pp. 486-490.

* cited by examiner

Fig 3 step 1 step 2 step 3, 4 step 5, 6

Fig 4

DYE-SENSITIZED SOLAR CELL AND A METHOD FOR MANUFACTURING THE SOLAR CELL

FIELD OF THE INVENTION

The present invention relates to a dye-sensitized solar cell. The present invention also relates to a method for manufacturing dye-sensitized solar cells.

PRIOR ART

Dye-sensitized solar cells (DSC) have been under development for the last 20 years and work on similar principles as photosynthesis. Unlike silicon solar cells, these cells obtain energy from sunlight using dyes which can be manufactured cheap, environmentally unobtrusive and in abundance.

A conventional sandwich type dye-sensitized solar cell has a few μm thick porous $TiO_2$ electrode layer deposited onto a transparent conducting substrate. The $TiO_2$ electrode comprises interconnected $TiO_2$ metal oxide particles dyed by adsorbing dye molecules on the surface of the $TiO_2$ particles and forming a working electrode. The transparent conducting substrate is normally a transparent conducting oxide deposited onto a glass substrate. The transparent conducting oxide layer serves the function as an electron collector extracting photo-generated electrons from the working electrode. The $TiO_2$ electrode is in contact with an electrolyte and another transparent conducting substrate, i.e. a counter electrode.

Sunlight is harvested by the dye, producing photo-excited electrons that are injected into the conduction band of the $TiO_2$ particles and further collected by the conducting substrate. At the same time, $I^-$ ions in the redox electrolyte reduce the oxidized dye and transport the generated electron acceptor species to the counter electrode. The two conducting substrates are sealed at the edges in order to protect the DSC modules against the surrounding atmosphere, and to prevent the evaporation or leakage of the DSC components inside the cell.

During the last 5-10 years, a new kind of DSC has been developed—the solid state dye-sensitized solar cell. In this case the liquid electrolyte is replaced by one of several solid hole conducting materials like, e.g., CuI, CuSCN, P3HT or Spiro-OMeTAD. The fabrication of Solid State DSCs with 15.0% efficiency was reached by the means of a hybrid organic-inorganic perovskite CH3NH3PbI3 dye.

Chung et al report in Nature, volume 485, a dye sensitized solar cell having a semiconductor CsSnI3 perovskite hole conductor, instead of a liquid electrolyte.

WO2013/171520 describes an optoelectric device having a photoactive layer comprising a porous perovskite or a porous scaffold material coated with a semiconductor comprising a perovskite and a charge transporting material (hole or electron transporting material) is disposed within the pores of the porous material so that it is in contact with the perovskite semiconductor. The perovskite is reported to typically act as a light-absorbing material as well as charge transporting semiconductor. The photoactive layer is placed between a first electrode (back contact) and a second electrode (counter electrode).

WO 2011/096154 discloses a sandwich type DCS module including a porous insulation substrate, a working electrode including a porous conductive metal layer formed on top of the porous insulation substrate and creating an electron collector in form of a back contact, and a porous semiconductor layer containing an adsorbed dye arranged on top of the porous conductive metal layer, a transparent substrate facing the porous semiconductor layer, adapted to face the sun and to transmit the sun light to the porous semiconductor layer. The DSC module further includes a counter electrode including a conducting substrate arranged on a side opposite to the porous semiconductor layer of the porous insulation substrate, and at a distance from the porous insulation substrate, thereby forming a space between the porous insulation substrate and the conducting substrate. An electrolyte is filled in the space between the working electrode and the counter electrode. The porous conductive metal layer may be created using a paste including metallic or metal based particles which is applied on top of the porous insulation substrate by printing, and followed by heating, drying and baking. An advantage with this type of DSC module is that the conducting layer of the working electrode is arranged between the porous insulation substrate and the porous semiconductor layer. Thus, the conducting layer of the working cell does not have to be transparent, and can be made of a material of high conductivity, which increases the current-handling capability of the DSC module and ensures high efficiency of the DSC module.

Figure 1:
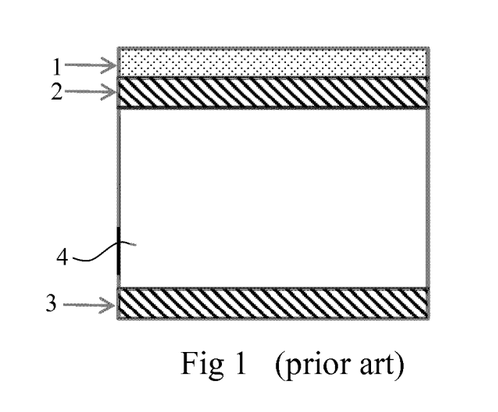
FIG. 1 shows a prior art dye-sensitized solar cell.

FIG. 1 shows an example of a prior art monolithic dye-sensitized solar cell comprising a working electrode in the form of a light absorbing layer 1, a first conducting layer 2 for extracting photo-generated electrons from the light absorbing layer, a porous insulation substrate 4, and a counter electrode including a second conducting layer 3 arranged on the opposite side of the porous insulation substrate 4. The light absorbing layer 1 may include a porous metal oxide with light absorbing material deposited on a top side. The porous insulation substrate 4 is, for example, made of a ceramic microfiber. The first conducting layer 2 is a layer of a porous conductive material deposited on one side of the porous insulation substrate 4. The second conducting layer 3 is a layer of a porous conductive material deposited on the other side of the porous insulation substrate 4. The first and second conducting layers are, for example, printed on the porous insulation substrate. The porous insulation substrate is electrically insulating. Both conducting layers 2, 3 consist of particles that are large enough to not penetrate the pores of the porous substrate. The substrate 4 serves the function of separating the conducting layers physically and electrically in order to avoid direct electronic short circuit between the conducting layers 2, 3. Further, to allow the first and second conducting layers 2, 3 to be printed on the porous substrate, the porous substrate should be suitable for printing.

The electrode configuration in FIG. 1 is infiltrated with an electrically conducting medium in the pores of the light absorbing layer, in the pores of the first and second conducting layers, and in the pores of the porous substrate (not shown in FIG. 1). The conducting medium forms a continuous layer inside the pores of the conducting layers, and between the conducting layers inside the pores of the porous insulation substrate thereby enabling transport of electrical charge between the counter electrode and the working electrode including the light absorbing layer 1. The first conducting layer extracts the electrons from the light absorbing layer and transports the electrons via an external electrical circuit to the counter electrode (not shown in FIG. 1). The counter electrode is used to transfer the electrons to the conducting medium. The conducting medium transfers electrons back to the light absorbing layer thereby completing the electrical circuit.

Depending on the nature of the conducting medium, either ions or electrons and holes, can be transported between the counter electrode and the working electrode. Electrolytes are used as conducting medium to transport ions between the counter electrode and the light absorbing layer of the working electrode. Examples of electrolytes are liquid electrolytes (such as those based on the I−/I3−, redox couple or cobalt complexes as redox couple), gel electrolytes, dry polymer electrolytes and solid ceramic electrolytes. When ionic charge transporting materials are used as conducting medium, the counter electrode is normally equipped with a catalytic substance that serves the purpose of facilitating the transfer of electrons to the electrolyte.

Semiconductors can be used as conducting medium to transport electrons and holes between the counter electrode and light absorbing layer of the working electrode. Examples of semiconductors are inorganic semiconductors, such as CuSCN or CuI, and organic semiconductors, such as, e.g., Spiro-OMeTAD. When semiconductors are used as conducting medium, the counter electrode is normally equipped with a substance that serves the purpose of creating a good electrical contact, i.e., a low resistive good ohmic contact, between the counter electrode and the conducting medium. Examples of materials for such contacts are, e.g., gold, silver, carbon containing materials such as graphite or graphene and highly conducting metal oxides such as FTO, ITO or aluminum doped ZnO or conducting polymers such as PEDOT:PSS, polythiophene, polyacetylene, polyaniline, polypyrrole etc. An advantage using semiconductors as conducting medium in a solar cell is that they are solid and there is less risk for leakage. A disadvantage with the semiconductors is their poor conductivity.

The conducting medium exhibits a certain electrical resistance to transport charges. The electrical resistance increases with the charge transport distance. Therefore, when electrical charge is transported between the counter electrode and the light absorbing layer, there will always be a certain electrical resistive loss in the conducting medium. By making the porous substrate thinner, the resistive losses can be reduced. However, when the porous substrate becomes thinner it also becomes more mechanically fragile.

Certain conducting media, such as semiconductors, ionic liquid based electrolytes and cobalt complex electrolytes, can have very low electrical conductivity resulting in very large electrical resistive losses.

OBJECT AND SUMMARY OF THE INVENTION

The object of the present invention is to provide a monolithic dye-sensitized solar cell having reduced resistive losses in the conducting medium.

This object is achieved by a dye-sensitized solar cell as described herein.

The dye-sensitized solar cell comprises:
a light absorbing layer,
a first conducting layer for extracting photo-generated electrons from the light absorbing layer,
a counter electrode including a second conducting layer,
a porous insulating layer disposed between the first and second conducting layers,
a third conducting layer disposed between the porous insulating layer and the second conducting layer and in electrical contact with the second conducting layer, and the third conducting layer includes a porous substrate made of an insulating material, and conducting particles forming a conducting network through the insulating material, and a conducting medium for transferring charges between the counter electrode and the light absorbing layer.

With the term "the conducting particles forming a conducting network through the insulating material" is meant that the particles form one or more electrically conducting paths through the insulating material in the layer.

Due to the conducting network in the porous substrate, the distance between the counter electrode and the light absorbing layer does no longer depend on the thickness of the porous substrate. Thus, the thickness of the insulating layer can be reduced, and by that the distance between the counter electrode and the light absorbing layer can be reduced. Accordingly the resistive losses in the conducting medium is reduced. Due to the fact that the distance between the counter electrode and the light absorbing layer does no longer depend on the thickness of the porous substrate, it is also possible to use a substrate that is thick enough for safe mechanical handling.

The conducting network provides an extension of the counter electrode, which extends into the porous substrate. The present invention makes it possible to provide a minimum distance between the light absorbing layer and the counter electrode in order to achieve minimum electrical resistive losses in the conducting medium.

The porous substrate handled during the manufacturing of the solar cell will be the porous substrate of the third conducting layer, or an integral substrate comprising the porous substrate of the third conducting layer and the porous insulation layer. The substrate to be handled can thus have an adequate thickness, and the porous insulating layer preventing short-circuit between the first and second conducting layers can be thin and electrical resistive losses be minimized.

The porous insulating layer prevents short circuit between the first and second conducting layers. The conducting particles in the third conducting layer form a conducting network through the insulating material of the substrate. The conducting network is in electrical contact with the second conducting layer of the counter electrode and will therefore significantly increase the conductive surface area of the counter electrode. The conducting surface area serves the function of transferring electrons or holes from the counter electrode to the conducting medium. The conducting network in the substrate and the thus increased conductive surface area of the counter electrode decrease the charge transfer resistance between the conducting medium and the counter electrode. Additionally, since the third conducting layer forms a conducting network extending through the insulating material of the substrate, the distance between the light absorbing layer and the third conducting layer is shorter than the distance between the light absorbing layer and the second conducting layer. Consequently, since the third and second conducting layers are in electrical contact, the effective distance between the light absorbing layer and the second conducting layer is shorter and the resistive losses in the conducting medium are therefore reduced.

The present invention makes it possible to design the porous insulating layer with an optimal thickness in dependence on demands on resistance and mechanical properties of the insulating layer. An advantage achieved with the present invention is that it is possible to have a thin porous insulating layer disposed between the first and second conducting layer and still use a thick porous substrate having sufficient good mechanical properties for printing the first and second conducting layers. The invention makes it possible to use a thick porous substrate, and still achieve minimum electrical resistive losses in the conducting medium.

A further advantage achieved with the present invention is that the efficiency of the counter electrode is increased due to the fact that the third conducting layer increases the surface of the counter electrode.

A further advantage achieved with the present invention is that the effective distance between the light absorbing layer and the second conducting layer is reduced and therefore the resistive losses in the conductive medium is reduced as well resulting in a higher efficiency of the solar cell.

A further advantage achieved with the present invention is that it enables the use of conducting media having low electrical conductivity, such as solid state hole conductors, ionic liquid based electrolytes or cobalt complex based electrolytes.

The size of the conducting particles in the third conducting layer is smaller than the size of the pores of the porous substrate, and the conducting particles are accommodated in the pores of the porous substrate.

Preferably, the porous insulating layer is thinner than the porous substrate. Preferably, the porous insulating layer is also thinner than the third conducting layer.

The porous substrate extending from the second conducting layer to the porous insulating layer comprises infiltrated conducting particles. The porous insulating layer extends from the porous substrate to the first conducting layer and may be formed as an integral part of the porous substrate or be a separate layer on the porous substrate.

The conducting medium for transferring charges between the counter electrode and the light absorbing layer can be any suitable conducting medium. Charges in the form of ions, or electrons and holes can be transported between the counter electrode and the light absorbing layer. The conducting medium can be a liquid, for example a liquid electrolyte, a gel, or a solid material such as a semiconductor.

The conducting medium for transferring charges is disposed within the pores of the porous materials of the light absorbing layer, the first conducting layer, the porous insulation layer and the porous substrate.

The solar cell is preferably a monolithic dye-sensitized solar cell. A monolithic dye-sensitized solar cell is characterized in that all layers are directly or indirectly deposited on one and the same porous substrate.

The first and second conducting layers are positioned on a shadow side of the light absorbing layer, i.e. the side opposite the side receiving the light. Thus, the first and second conducting layers are positioned on the same side of the light absorbing layer.

According to an embodiment of the invention, the porous insulation substrate comprises woven microfibers. Woven microfibers are mechanically strong. Preferably, the woven microfibers are ceramic microfibers, such as glass fibers. A microfiber is a fiber having a diameter less than 10 μm and a length larger than 1 nm. Ceramic microfibers are fibers made of a refractory and inert material, such as glass, $SiO_2$, $Al_2O_3$ or aluminosilicate. The porous substrate may further comprise non-woven microfibers. The non-woven microfibers can, for example, be organic microfibers. Organic microfibers are fibres made of organic materials such as polymers such as, e.g., polycaprolactone, PET, PEO etc, or cellulose such as, e.g., nanocellulose (MFC) or wood pulp. The non-woven microfibers can also be inorganic such as, glass, $SiO_2$, $Al_2O_3$ or aluminosilicate.

According to an embodiment of the invention, the thickness of the third conducting layer is less than 1 mm, and preferably less than 100 μm. Due to the fact that the third conducting layer is very thin, the demand on the conductivity of the third conducting layer is rather low, and lower than the demand on the conductivity of the first and second layers. Thus, the network of conducting particles achieves a sufficient conductivity.

According to an embodiment of the invention, the thickness of the porous insulating layer is between 0.1 μm and 20 μm, and preferably between 0.5 μm and 10 μm. Thus, the electrical resistive losses in the conducting medium are reduced and still short circuit is avoided between the first and third conducting layer.

The thickness of the first conducting layer is advantageously also kept thin in order to have a short distance between the light absorbing layer and the third conducting layer and the counter electrode. The thickness of the first conducting layer can be between 0.1 and 40 μm, and preferably between 0.3 and 20 μm.

According to an embodiment of the invention, the conducting particles in the third conducting layer are made of the same material as is used in the second conducting layer. The conducting particles can be made of metal, metal alloy, metal oxide, or other conducting materials, for example, titanium, titanium alloys, nickel, nickel alloys, carbon based materials, conducting oxides, conducting nitrides, conducting carbides, conducting silicides, or mixtures thereof. For example, the conducting particles in the third conducting layer are made from a material selected from a group consisting of titanium, titanium alloys, nickel, nickel alloys, carbon based materials such as graphene or graphite or carbon black or carbon nanotubes, conducting oxides, conducting nitrides, conducting carbides, conducting silicides or mixtures thereof. The conducting particles can also be catalytic.

Preferably, the first and second conducting layers are made of a material selected from a group consisting of titanium, titanium alloys, nickel, nickel alloys, graphite, and amorphous carbon, or mixtures thereof. Most preferably, the conducting layers 2, 3 are made of titanium or a titanium alloy or mixtures thereof. Other types of platinized conducting particles can be used instead of FTO, such as, e.g., ATO, ITO, graphite, carbon black, graphene, or carbon nanotubes. Further, it is possible to use particles that are both conducting and catalytic such as metal carbides, metal nitrides and metal silicides.

According to one embodiment of the invention, the porous insulating layer is a part of the porous substrate. The solar cell comprises a porous substrate made of an insulating material and comprising a first portion including said conducting particles and a second portion without any conducting particles, and the first portion forms said third conducting layer and the second portion forms said porous insulating layer. The second portion of the porous substrate may be thinner than the first portion of the porous substrate. In this embodiment, the third conducting layer and the porous insulating layer are different parts of the same porous substrate. Thus, the porous insulating layer can be formed as an integral part of the porous substrate or be a separate layer on the porous substrate. The portion of the substrate comprising conducting particles extends from the second conducting layer towards the first conducting layer and ends at a distance from the top side of the substrate, to form the porous insulating layer. An advantage with this embodiment is that it is easy to manufacture.

According to an embodiment of the invention, the porous insulating layer is disposed on one side of the porous substrate, and the second conducting layer is disposed on the opposite side of the porous substrate. For example, the porous insulating layer is printed on the porous insulation substrate. In this embodiment of the invention, the porous insulating layer is formed as a separate layer on the porous substrate.

According to an embodiment of the invention, the solar cell is characterised in that it comprises a porous substrate extending from the second conducting layer to a porous insulating layer and comprises conductive particles forming a conducting network in electrical contact with the second conducting layer.

According to an embodiment of the invention, the porous substrate and the porous insulating layer are formed as integral layers of an insulating material.

According to an embodiment of the invention, the porous insulating layer is a separate layer disposed on the porous substrate and both the porous insulating layer and the porous substrate are made of an insulating material.

According to an embodiment of the invention, the porous insulating layer and the porous substrate comprise an insulating material comprising woven microfibers. Woven microfibers includes pores suitable for accommodating the conducting particles. The porous insulating layer may include non-woven microfibers.

According to an embodiment of the invention, the conducting medium is a cobalt complex based electrolyte. An advantage with using a cobalt complex based electrolyte is its high efficiency.

According to an embodiment of the invention, the conducting medium is an ionic liquid based electrolyte. An advantage with using an ionic liquid based electrolyte is that it can render high long term stability to the solar cell performance.

According to an embodiment of the invention, the conducting medium is a solid state hole conductor. A solid state hole conductor is, for example, a semiconductor. An advantage using a hole conductor is that it is a solid material and accordingly the requirement of sealing of the solar cell is reduced. Examples of semiconductors are inorganic semiconductors, such as CuSCN or CuI, and organic semiconductors, such as, e.g., P3HT or Spiro-OMeTAD.

According to an embodiment of the invention, the conducting medium is a solid state hole conductor, or an ionic liquid based electrolyte, or a cobalt complex based electrolyte. Semiconducting perovskites, like $CH_3NH_3PbI_3$, $CH_3NH_3PbI_{3-x}Cl_x$ or $CH_3NH_3SnI_3$ or other suitable perovskites can be used.

According to an embodiment of the invention, the light absorbing layer comprises a perovskite, like $CH_3NH_3PbI_3$, $CH_3NH_3PbI_{3-x}Cl_x$ or $CH_3NH_3SnI_3$. Also other suitable perovskites can be used. An advantage of using a perovskite is that high solar cell efficiencies can be reached.

According to an embodiment of the invention a perovskite layer can be applied directly onto a first conducting layer of titanium and with the titanium having a surface layer of TiO2. Thus, the separate nanoparticle layer of TiO2 can be omitted.

According to an embodiment of the invention, the light absorbing layer is a porous TiO2 nanoparticle layer with adsorbed organic dye. Examples of organic dyes are: N719, N907, B11, C101. Also other organic dyes can be used.

A monolithic dye-sensitized solar cell can be manufactured by depositing a first conducting layer onto one side of a porous insulating substrate and a counter electrode including a second conducting layer onto the other side of the porous insulating substrate. The light absorbing layer can be deposited onto the first conducting layer. This structure has several advantages such as ease of large-scale manufacturing and providing a well-defined and constant distance between the second conducting layer and the light absorbing layer. The choice of conducting medium for transferring charges between the counter electrode and the light absorbing layer is restricted by the resistive losses in the conductive medium. By minimizing the distance between the counter electrode and the light absorbing layer, it is possible to minimize the resistive loss. By making the porous substrate thinner, the resistive losses can be reduced and will not restrict use of conducting medium for transferring charges having high resistive losses. However, very thin porous substrates are difficult to handle and may not have adequate mechanical strength for handling in a production facility.

Another object of the present invention is to provide a method for manufacturing a monolithic dye-sensitized solar cell according to the invention.

This object is achieved by a method as described herein.
The method comprises:
depositing a blocking agent on a top side of a porous substrate made of an insulating material, to form a blocking layer in a first portion of the substrate,
infiltrating the porous substrate from a bottom side of the substrate with conducting particles having a size smaller than the pore size of the substrate to form a third conducting layer in a second portion of the substrate,
depositing an ink comprising conductive particles on the top side of the insulation substrate to form the first conducting layer,
depositing an ink comprising conductive particles on the bottom side of the porous substrate to form the second conducting layer, and
heat treating the formed structure to burn off the blocking layer thus forming the porous insulating layer.

The order of the method steps may vary within the scope of the claims. For example, the second conducting layer can be made before the first conducting layer.

An advantage with this method is that it is easy to manufacture the dye-sensitized solar cell according to the invention.

According to an embodiment of the invention, the blocking agent comprises fibers having a diameter between 1 nm and 5 μm.

The blocking layer may consist of polymers, ceramic particles, glass fibers, polymer fibres, carbon nanotubes (CNT), nanocellulose or microfibrillated cellulose (MFC). It is advantageous to use fibers as a blocking agent in the blocking layer. It is advantageous to use fibers with very small diameter.

This object is achieved by a method as described herein.
The method comprises:
providing a porous substrate (8) made of an insulating material,
infiltrating the porous substrate with conducting particles having a size smaller than the pore size of the substrate to form a third conducting layer (6a),
depositing a layer of insulating material on a top side of the porous substrate to form the porous insulating layer (5a),
depositing a porous conductive layer on the porous insulating layer (5a) to form the first conducting layer, and depositing an ink comprising conductive particles on a bottom side of the insulation substrate to form the second conducting layer.

The order of the method steps may vary within the scope of the claims. For example, the second conducting layer can be made before the first conducting layer. For example, the deposition of a porous conductive layer is a deposition of an ink comprising conductive particles.

The porous insulating layer may be deposited on the porous substrate by screen printing, slot die coating, spraying, or wet laying. The first and second conducting layers can, for example, be deposited by printing. The first conducting layer may alternatively be formed by evaporation or sputtering of a titanium layer onto the porous insulating layer, or any other method for depositing a thin layer of titanium onto the porous insulating layer.

The first and second conducting layer may alternatively be formed by evaporation or sputtering of a titanium layer onto the porous insulating substrate or any other method for depositing a thin layer of titanium onto the porous insulating substrate.

The light absorbing layer is, for example, formed by depositing a porous TiO2 layer onto the first conducting layer and thereafter adsorb a dye onto the TiO2 layer.

In an alternative embodiment a layer of perovskite is directly formed onto the first conducting layer after the first conducting layer has been treated so that the surface of the first conducting layer is made of a TiO2 film.

BRIEF DESCRIPTION OF THE DRAWINGS

The invention will now be explained more closely by the description of different embodiments of the invention and with reference to the appended figures.

DETAILED DESCRIPTION OF PREFERRED EMBODIMENTS OF THE INVENTION

Figure 2:
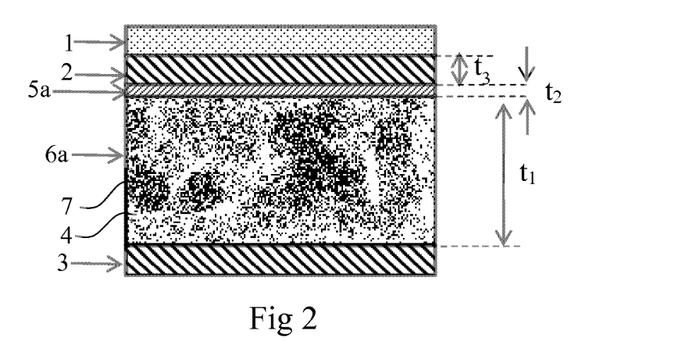
FIG. 2 shows an example of a dye-sensitized solar cell according to the invention.

FIG. 2 shows a first example of a dye-sensitized solar cell according to the invention. The dye-sensitized solar cell comprises a working electrode in the form of a light absorbing layer 1, a first conducting layer 2 for extracting photo-generated electrons from the light absorbing layer 1, a counter electrode including a second conducting layer 3, a porous insulating layer 5a arranged between the first and second conducting layers, and a conducting medium (not shown) for transferring charges between the counter electrode and the working electrode. The dye-sensitized solar cell further comprises a third conducting layer 6a disposed between the porous insulating layer 5a and the second conducting layer 3 and in electrical contact with the second conducting layer 3.

The third conducting layer 6a includes a porous substrate 4 made of an insulating material and conducting particles 7 forming a conducting network through the porous substrate 4. The conducting particles are disposed in pores of the porous substrate 4. The porous insulating layer 5a is suitably formed by printing a layer of insulating material on a top side of the porous substrate 4. The insulating material is, for example, an inorganic material that is positioned between the first and third conducting layers and insulates the first and third conducting layers from each other and creates a porous insulating layer between the first and third conducting layer after heat treatment. The porous substrate 4 extends from the second conducting layer 3 to the porous insulating layer 5a. In this embodiment, the porous insulation layer 5a is a separate layer disposed on one side of the porous substrate 4. The first conducting layer 2 is, for example, formed by printing conducting particles on the porous insulating layer 5a. Suitably, all of the layers 1,2,3 and 5a are formed by printing. The porous insulating layer 5a is, for example, made of ceramic microfibers, or materials derived by delaminating layered crystals such 2D materials or nanosheets.

Figure 3:
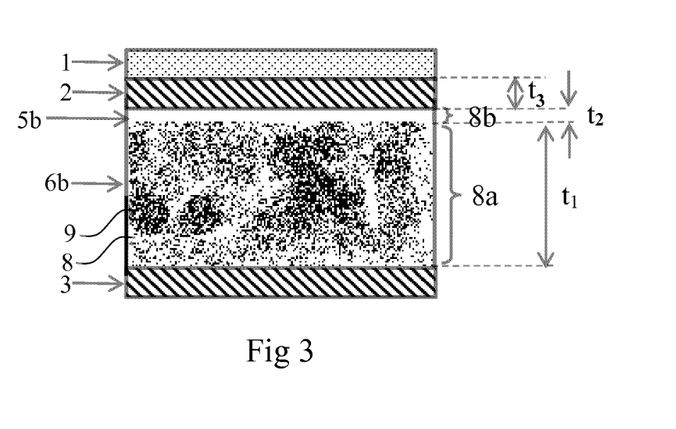
FIG. 3 shows another example of a dye-sensitized solar cell according to the invention.

FIG. 3 shows a second example of a dye-sensitized solar cell according to the invention. The dye-sensitized solar cell comprises a working electrode in the form of a light absorbing layer 1, a first conducting layer 2, a counter electrode including a second conducting layer 3, and porous substrate 8 made of an insulating material. The porous substrate 8 comprises a first portion 8a including conducting particles 9 forming a conducting network in the insulating material of the porous substrate, and a second portion 8b without any conducting particles and forming a porous insulating layer 5b. Thus, the first portion 8a forms a third conducting layer 6b, and the second portion 8b forms a porous insulating layer 5b. In this embodiment, the porous insulating layer 8b is formed as an integral part of the porous substrate 8.

The conducting layers 2,3,6a,6b are porous to allow a conducting medium to penetrate through the conducting layers. Suitably, the conducting medium is a solid state hole conductor, or an ionic liquid based electrolyte or a cobalt complex based electrolyte.

However, the conducting medium can be any suitable conducting medium. The conducting medium can be a liquid, a gel, or a solid material such as a semiconductor. Examples of electrolytes are liquid electrolytes (such as those based on the I−/I3−, redox couple or cobalt complexes as redox couple), gel electrolytes, dry polymer electrolytes and solid ceramic electrolytes. Examples of semiconductors are inorganic semiconductors, such as CuSCN or CuI, and organic semiconductors, such as, e.g., Spiro-OMeTAD.

The porous substrate 4, 8 is, for example, made of microfibers. A microfiber is a fibre having a diameter less than 10 μm and length larger than 1 nm. Suitably, the porous substrate comprises woven microfibers. Ceramic microfibers are fibres made of a refractory and inert material, such as glass, SiO2, Al2O3 and aluminosilicate. Organic microfibers are fibres made of organic materials such as polymers such as, e.g., polycaprolactone, PET, PEO etc, or cellulose such as, e.g., nanocellulose (MFC) or wood pulp. The porous substrate 4, 8 may comprise woven microfibers and non-woven microfibers disposed on the woven microfibers. The thickness of the porous substrate 4, 8 is suitably between 10 μm and 1 mm. Such a layer provides the required mechanical strength.

The porous substrate 4, 8 is infiltrated by conducting particles 7 so that a conducting network is formed through the insulating material and by that the third conducting layer 6a, 6b is achieved. The network of electrical particles in the third layer is in electrical contact with the second conducting layer 3. The porous insulating layer 5a, 5b prevents short circuit between the first and second conducting layers. The conducting particles must be smaller than the pore size of the substrate 4, 8 in order to be infiltrated effectively. The conducting particles form a conducting network 7,9 through the insulating material of the substrate. The conducting network 7,9 is in direct physical and electrical contact with the second conducting layer 3 of the counter electrode. The conducting particles serve the function of transferring electrons from the counter electrode to the conducting medium. The resistive losses in the conducting medium are reduced due to the conducting network in the substrate. Thus, it possible to use a thick porous substrate, and still achieve minimum electrical resistive losses in the conducting medium.

Since the network of conducting particles is in direct physical and electrical contact with the counter electrode and in the same time are infiltrated a certain distance into the substrate, it is possible for the counter electrode to transfer electrons via the conducting particles to the conducting medium effectively closer to the light absorbing layer resulting in a smaller effective distance between the counter electrode and the light absorbing layer. Therefore the electrical losses in the conducting medium can be reduced by infiltrating conducting particles into the substrate. In the case of using a semiconductor with low electronic conductivity as a conducting medium, it is necessary to infiltrate the semiconductor through the light absorbing layer and through the current collecting layer and into the porous substrate deep enough such that the semiconductor is brought into direct physical and electrical contact with the infiltrated conducting particles.

Preferably, the thickness t1 of the third conducting layer 6a, 6b is less than 1 mm, and most preferably less than 100 μm. In this example, the porous substrate 4 has been infiltrated with conducting particles from a bottom side. The conducting particles can also be catalytic. The conducting particles can be made of metal, metal alloy, metal oxide, or other conducting materials, for example, titanium, titanium alloys, nickel, nickel alloys, carbon based materials, conducting oxides, conducting nitrides, conducting carbides, conducting silicides, or mixtures thereof.

Electrical contact between the first and second conducting layers is prevented by the porous insulating layer 5a,5b. For example, the thickness t2 of the porous insulating layer is between 0.1 μm and 20 μm, and preferably between 0.5 μm and 10 μm.

The conducting layers 2,3,6a,6b are porous to allow the conducting medium to penetrate through the conducting layers. The material forming the conducting layer 2, 3 must have a suitable corrosion resistance as to withstand the environment in the solar cell, and preferably also be resistant to temperatures above 500° C. in air without losing adequate conductivity. Preferably, the conducting layers 2, 3 are made of a material selected from a group consisting of titanium, titanium alloys, nickel, nickel alloys, graphite, and amorphous carbon, or mixtures thereof. Most preferably, the conducting layers 2, 3 are made of titanium or a titanium alloy or mixtures thereof.

Preferably, the thickness t) of the first conducting layer 2 is between 0.1 and 40 μm, or preferably between 0.3 and 20 μm.

The light absorbing layer 1 of the working electrode may include a porous TiO2 electrode layer deposited onto the first conducting layer 2. The TiO2 electrode layer may comprise TiO2 particles dyed by adsorbing dye molecules on the surface of the TiO2 particles. Alternatively, the first conductive layer has a surface layer of TiO2 and the light absorbing layer is a perovskite layer. The porosity of the porous substrate will enable charge transport through the substrate.

In the following, an example of a method for manufacturing the first example of a solar cell according to the invention is described.

A porous substrate 4 made of an insulating material is infiltrated with conducting particles having a size smaller than the pore size of the substrate to form a third conducting layer. The substrate is infiltrated so that a network of conduction particles is formed through the entire substrate. A layer of insulating material is deposited on one side of the porous substrate to form a porous insulating layer. The insulating material is, for example, microfibers made of a ceramic or organic material. An ink comprising conductive particles are deposited on the porous insulating layer to form the first conducting layer, and an ink comprising conductive particles are deposited on an opposite side of the porous substrate to form the second conducting layer. The porous insulating layer is, for example, deposited on the porous substrate by screen printing, slot die coating, spraying, or wet laying. The porous first and second conducting layers are, for example, deposited on the porous substrate by screen printing or any other suitable printing technique.

Figure 4:
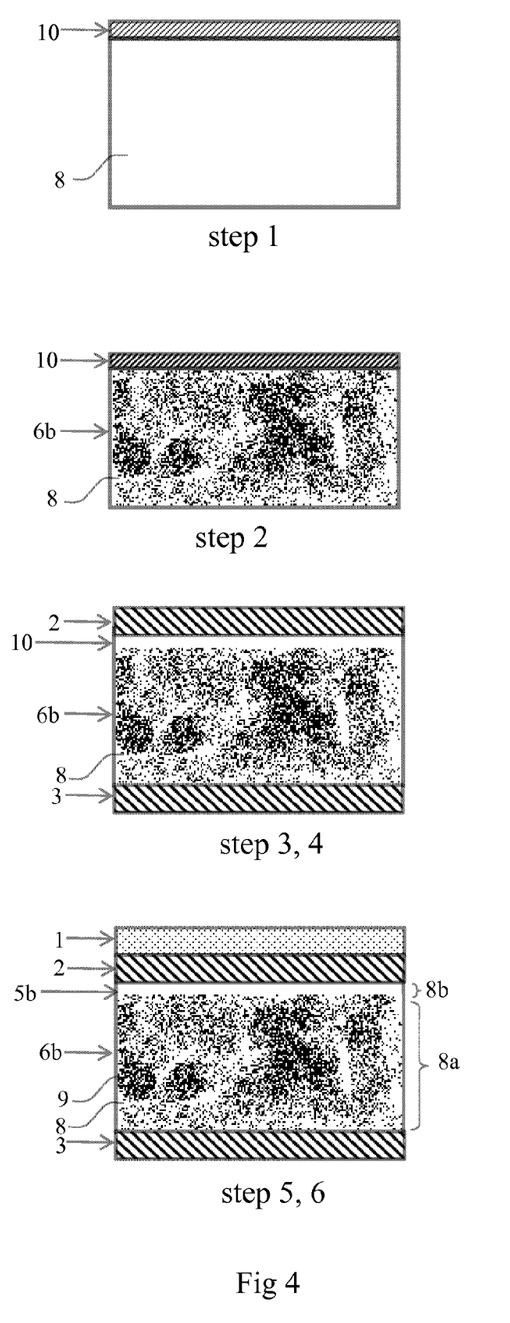
FIG. 4 illustrates an example of a method for manufacturing a dye-sensitized solar cell according to the invention.

In the following an example of a method for manufacturing the second example of a solar cell according to the invention is described with reference to FIG. 4. FIG. 4 illustrates the deposition sequence in the manufacturing method.

Step 1: A blocking agent is deposited on a top side of a substrate 8 made of an insulating material, to form a blocking layer 10 in a second portion 8b of the substrate 8. The blocking layer is deposited in order to physically prevent the conducting particles from being infiltrated all the way to other side of the substrate. Therefore, the blocking layer 10 prevents direct physical and electrical contact between the first conducting layer and the conducting particles. The blocking layer may consist of polymers, ceramic particles, polymer fibres, glass fibers, carbon nanotubes (CNT), nanocellulose or microfibrillated cellulose (MFC). It is advantageous to use fibers as a blocking agent in the blocking layer. It is advantageous to use fibers with very small diameter.

Step 2: The porous substrate 8 is infiltrated from a bottom side of the substrate with conducting particles having a size smaller than the pore size of the substrate to form a third conducting layer 6b in a first portion 8a of the substrate. The conducting particles may consist of the same material as is used in the second conducting layer. It is also possible to use other types of particles such as carbon based materials (graphite, carbon black, CNT, graphene, etc). It is also possible to use other types of particles such as conducting oxides (ITO, FTO, ATO etc) or carbides, nitrides or silicides.

Step 3: An ink comprising conductive particles is printed on the top side of the porous substrate 8 to form the first conducting layer 2.

Step 4: An ink comprising conductive particles is printed on the bottom side of the porous substrate 4 to form the second conducting layer 3.

Step 5: A TiO2 electrode layer is deposited onto the first conducting layer 2 to form the working electrode 1.

Step 6: The substrate is heat treated to burn off the blocking layer 10 thus forming the porous insulating layer 5b.

In the following two more detailed examples of methods for manufacturing a solar cell according to the invention will be described.

Example 1

Liquid Redox Electrolyte Based Dye-Sensitized Solar Cell (DSC)

In the first step a 28 µm thin glass fabric (M51037, Asahi Kasei E-materials), was wet laid with a glass microfiber stock solution containing C-glass microfiber, fiber diameter: 0.5 µm) and water based colloidal silica.). The wet laid glass fabric was then dried at 110° C. 5 min in air in a belt oven.

Subsequently in a second step the glass microfiber deposited glass fabric was then wet laid with a solution containing dispersed glass microfibers and nanocellulose on the other side in order to create a blocking layer: The nanocellulose which was added to the second glass fiber stock serves the function of creating a blocking layer that prevents conducting particles from passing through the blocking layer. The blocking effect can be enhanced by increasing the amount of added nanocellulose to the glass fiber stock. Thus, infiltrated particles in the third conducting layer can therefore be blocked by the blocking layer.

A variation of the second step is to omit adding glass microfiber to the solution that contains nanocellulose and is used to create the blocking layer. Another variation of the second step is to print or spray a solution of nanocellulose onto one of the sides of the dried glass microfiber treated glass fabric in order to create a blocking layer. Another variation of the second step is to use dispersed carbon nanotubes or a dispersed 2D material instead of nanocellulose in order to create a blocking layer.

Subsequently in a third step, an ink containing platinized FTO particles was prepared by first mixing FTO particles of 80 nm diameter with an isopropanol solution of hexachloroplatinic acid and then drying the mixture at 60 C for 30 min and then heating the treated powder in air to 400 C for 15 min. After the heat treatment the platinized FTO powder was grinded together with terpineol in a ball mill to create the final ink containing platinized FTO particles in terpineol. In the next step the double sided deposited glass fabric with a blocking layer was infiltrated with conducting catalytic particles by printing, for example, screen printing, the ink containing platinized FTO particles on the non-woven glass microfiber side opposite to the blocking layer side. The printed ink was then allowed to dry in air at 120 C for 10 min.

A variation of the third step is to use other types of platinized conducting particles instead of FTO, such as, e.g., ATO, ITO, graphite, carbon black, graphene, or carbon nanotubes. Another variation of the third step is to use particles that are both conducting and catalytic such as metal carbides, metal nitrides and metal silicides.

Subsequently in a fourth step an ink was prepared by mixing $TiH_2$ with terpineol using 50:50 ratio by weight. The ink was then bead milled for 25 minutes at 5000 RPM using 0.3 mm zirconia beads. The zirconia beads were then separated from the ink by filtration. The filtered ink was then printed onto the double sided deposited glass fabric having a blocking layer and layer of infiltrated platinized FTO particles and then dried at 200° C. for 5 minutes. Subsequently the filtered ink was printed onto the other side of the glass fabric and then dried at 200° C. for 5 minutes. Subsequently the deposited glass fabric was vacuum sintered at 600° C. The pressure during sintering was lower than 0.0001 mbar. Consequently a first conducting layer and a second conducting layer and a third conducting layer was formed after the vacuum heating process.

Subsequently in a fifth step a $TiO_2$ based ink (Dyesol 18NR-T) was screen printed on top of the first conducting layer and then dried at 120 C for 10 min.

Subsequently in a sixth step the treated glass fabric was heated in air to 500 C for 20 minutes. Consequently the deposited $TiO_2$ layer was sintered and the nanocellulose based blocking layer was removed by combustion.

Subsequently in a seventh step the treated glass fabric was immersed in a solution of 1 mM Z907 dye in methoxypropanol and heat treated at 70° C. for 120 minutes and then rinsed in methoxy propanol and dried. Consequently the sintered $TiO_2$ film was dye-sensitized.

Subsequently in an eighth step an iodide/triiodide (I–/I3)- based redox electrolyte containing polymer was deposited on top of the $TiO_2$ layer in the form of a gel.

Subsequently in a ninth step the cell was sealed by infiltrating a polymer at the edges around the DSC and covering the both sides with glass in the same time allowing for external electrical connection to the first and second conducting layer.

Example 2

Solid State Hole Conductor Based DSC

In the first step same materials and procedure as the first step in example 1 is used.

Subsequently in a second step same materials and procedure as in the second step in example 1 is used.

Subsequently in a third step an ink containing carbon particles was prepared by mixing 75 grams graphite and 25 grams carbon black (Super P-Li) and 15 grams of $TiO_2$ (20 nm diameter) with terpineol then grinding the mixture in a ball mill to produce the final ink. In the next step the double sided deposited glass fabric with a blocking layer was infiltrated with conducting carbon particles by printing, for example screen printing, the ink on the non-woven glass microfiber side opposite to the blocking layer side. The printed ink was then allowed to dry in air at 120° C. for 10 min. A variation of the third step is to use carbon particles that are gold plated.

Another variation of the third step is to use other types of particles that have both sufficient conductivity and also low ohmic resistance to the hole conductor such as FTO or ITO.

Subsequently in a fourth step an ink was prepared by mixing $TiH_2$ with terpineol using 50:50 ratio by weight. The ink was then bead milled for 25 minutes at 5000 RPM using 0.3 mm zirconia beads. The zirconia beads were then separated from the ink by filtration. The filtered ink was then printed onto the double sided deposited glass fabric having a blocking layer and layer of infiltrated carbon particles and then dried at 200° C. for 5 minutes. Subsequently the filtered ink was printed onto the other side of the glass fabric and then dried at 200° C. for 5 minutes. Subsequently the deposited glass fabric was vacuum sintered at 600° C. The pressure during sintering was lower than 0.0001 mbar. Consequently a first conducting layer and a second conducting layer and a third conducting layer was formed after the vacuum heating process.

Subsequently in a fifth step a $TiO_2$ based ink (Dyesol 18NR-T) was screen printed on top of the first conducting layer and then dried at 120 C for 10 min. The $TiO_2$ based ink was diluted 5 times with terpineol before printing. A variation is to omit the fifth step and therefore to omit the deposition of the $TiO_2$ based ink.

Subsequently in a sixth step the treated glass fabric was heated in air to 500 C for 20 minutes. Consequently the deposited $TiO_2$ layer was sintered and the nanocellulose blocking layer was removed by combustion.

In the case the deposition of $TiO_2$ was omitted in the fifth step there is no deposited $TiO_2$ layer to be sintered and the nanocellulose will be removed by combustion.

Subsequently in a seventh step a thin layer of a dimethylformamide solution of organic-inorganic perovskite ($CH_3NH_3PbI_3$) was ultrasonically sprayed onto the TiO2 layer and dried at 125 C for 30 min.

In the case the deposition of TiO2 was omitted in the fifth step the organic-inorganic perovskite is sprayed directly onto the first conducting layer after sintering of the first conducting layer.

A variation of the seventh step is to use mixed halides such as ($CH_3NH_3PbI_{3-x}Cl_x$).

Another variation of the seventh step is to use tin based perovskite such as $CH_3NH_3SnI_3$ Another variation of the seventh step is to deposit the solution of the perovskite by the ink jet method or by slot die coating.

Another variation of the seventh step is to deposit the perovskite in a sequential two-step process by first depositing PbI2 solution and then drying and then depositing CH3NH3I solution and then drying and then heating the two dried deposits in order to complete the reaction between PbI2 and CH3NH3I to form CH3NH3PbI3.

Another variation of the seventh step is to deposit the perovskite in a two-step process by first depositing SnI2 and then drying and then depositing CH3NH3I and then drying and then heating the two deposits in order to complete the reaction between SnI2 and CH3NH3I to form CH3NH3SnI3.

Subsequently in an eighth step a solution of spiro-MeOTAD (84 mg spiro-OMeTAD in 1 ml chlorobenzene, mixed with 7 microliters of tert-butyl pyridine and 15 microliters of LiTFSI (lithium bis(trifle romethanesulfonyl)imide) in acetonitrile) was ultrasonically sprayed on top of the TiO2 layer and dried 5 min at 50 C.

A variation of the eighth step is to deposit solutions of CuI, CuSCN or P3HT instead of spiro-OMeTAD as a hole conductor.

Subsequently in a ninth step the cell was sealed by infiltrating a polymer at the edges around the DSC and covering both sides with glass and in the same time allowing for external electrical connection to the first and second conducting layer.

The porous insulating layer 5a can be deposited on the porous substrate by any of screen printing, slot die coating, spraying, or wet laying.

The invention is not limited to the above described embodiment and can be varied within the scope of the claims. For example, the method for manufacturing a dye-sensitized solar cell can be carried out in many different ways.

The invention claimed is:

1. A dye-sensitized solar cell comprising:
a working electrode including a light absorbing layer (1),
a first conducting layer (2) for extracting photo-generated electrons from the light absorbing layer (1), wherein the light absorbing layer (1) is arranged on top of the first conducting layer (2),
a counter electrode including a second conducting layer (3),
a conducting medium for transferring charges between the counter electrode and the working electrode, and
a porous substrate (8) made of an insulating material and disposed between the first and second conducting layers (2, 3), the porous substrate (8) having a first portion (8a) including conducting particles L accommodated in the pores of the porous substrate (8) and forming a conducting network through the Insulating material, and a second portion (8b) without conducting particles and disposed between the first conducting layer (2) and the conducting network (8a), and
the conducting network of said first portion (8a) is in electrical contact with the second conducting layer (3) and provides an extension (6b) of said counter electrode which extends into the porous substrate (8), and the second portion (8b) forms a porous insulating layer (5b) between the first conducting layer (2) and the counter electrode (6b, 3).

2. The dye-sensitized solar cell according to claim 1, wherein the porous substrate comprise woven microfibers.

3. The dye-sensitized solar cell according to claim 1, wherein the thickness of the porous insulating layer is between 0.1 and 20 μm.

4. The dye-sensitized solar cell according to claim 1, wherein the thickness of the third conducting layer is less than 1 mm.

5. The dye-sensitized solar cell according to claim 1, wherein said conducting particles are made of the same material as is used in the second conducting layer.

6. The dye-sensitized solar cell according to claim 1, wherein said conducting particles are made from a material selected from the group consisting of titanium, titanium alloys, nickel, nickel alloys, carbon based materials, conducting oxides, conducting nitrides, conducting carbides, conducting silicides, and mixtures thereof.

7. The dye-sensitized solar cell according to claim 1, wherein said second portion of the porous substrate is thinner than said first portion of the porous substrate.

8. The dye-sensitized solar cell according to claim 1, wherein the porous insulating layer is disposed on one side of the porous substrate, and the second conducting layer is disposed on the opposite side of the porous substrate.

9. The dye-sensitized solar cell according to claim 1, wherein the conducting medium is an ionic liquid based electrolyte.

10. The dye-sensitized solar cell according to claim 1, wherein the conducting medium is a cobalt complex based electrolyte.

11. The dye-sensitized solar cell according to claim 1, wherein the conducting medium is a solid state hole conductor.

12. The dye-sensitized solar cell according to claim 11, wherein the solid state hole conductor is perovskite.

13. The dye-sensitized solar cell according to claim 1, wherein the light absorbing layer comprises perovskite.

14. The dye-sensitized solar cell according to claim 1, wherein the first conductive layer has a surface layer of TiO2 and the light absorbing layer is a perovskite layer.

15. The dye-sensitized solar cell according to claim 3, wherein the thickness of the porous insulating layer is between 0.5 and 10 μm.

16. The dye-sensitized solar cell according to claim 4, wherein the thickness of the third conducting layer is less than 100 μm.

17. The dye-sensitized solar cell according to claim 1, wherein the light absorbing layer (1) forms an outermost layer of the solar cell.

* * * * *